United States Patent [19]

Nomura et al.

[11] Patent Number: 4,996,123

[45] Date of Patent: Feb. 26, 1991

[54] OPTICALLY ORIENTED PHOTORESIST PATTERN FORMING METHOD USING ORGANIC CRYSTAL IN PHOTORESIST LAYER WITH SPECIFIED REFRACTING INDICES FORMULA

[75] Inventors: Noboru Nomura, Kyoto; Atsushi Ueno, Hirakata; Kazuhiko Hashimoto, Moriguchi; Satoshi Kinoshita, Tokyo, all of Japan

[73] Assignee: Matsushita Electric Industrial Co., Ltd., Osaka, Japan

[21] Appl. No.: 326,414

[22] Filed: Feb. 24, 1989

Related U.S. Application Data

[62] Division of Ser. No. 72,120, Jul. 10, 1987, abandoned.

[30] Foreign Application Priority Data

Jul. 11, 1986 [JP] Japan ................. 61-164052
Jul. 11, 1986 [JP] Japan ................. 61-164053
Jul. 11, 1986 [JP] Japan ................. 61-164054
Jul. 11, 1986 [JP] Japan ................. 61-164089

[51] Int. Cl.$^5$ .............................................. G03F 7/30
[52] U.S. Cl. ..................................... 430/20; 430/325; 430/326; 430/296; 430/330; 428/1; 350/341; 350/345; 350/348
[58] Field of Search ................. 430/20, 325, 326, 296; 428/1; 350/341, 345, 348

[56] References Cited

U.S. PATENT DOCUMENTS

| 3,143,423 | 8/1964 | Reynolds et al. | 430/197 |
| 3,952,405 | 4/1976 | Vest | 430/20 |
| 4,366,230 | 12/1982 | Ahne et al. | 350/341 |
| 4,526,854 | 7/1985 | Watanabe et al. | 430/28 |
| 4,618,514 | 10/1986 | McClelland et al. | 350/341 |
| 4,619,500 | 10/1986 | Ahne et al. | 350/341 |
| 4,656,116 | 4/1987 | Rohde et al. | 430/197 |
| 4,721,367 | 1/1988 | Yoshinaga et al. | 350/350 S |
| 4,772,885 | 9/1988 | Uehara et al. | 350/345 |
| 4,822,146 | 4/1989 | Yamanobe et al. | 350/348 |
| 4,857,427 | 8/1989 | Itoh et al. | 430/20 |

FOREIGN PATENT DOCUMENTS

| 1143723 | 7/1986 | Japan | 430/20 |
| 1208080 | 9/1986 | Japan | 430/20 |

Primary Examiner—Charles L. Bowers, Jr.
Attorney, Agent, or Firm—Wenderoth, Lind & Ponack

[57] ABSTRACT

An optically oriented photoresist material comprised of an organic polymer and an organic crystal material each having a different refractive index to form an optically oriented layer on a substrate wherein the optical waveguide is formed by an effect of the refractive index difference, and in said waveguide layer thus formed, the spread and scattering of lights are suppressed and very fine mask patterns of said photoresist can be produced.

7 Claims, 6 Drawing Sheets

FIG. 3
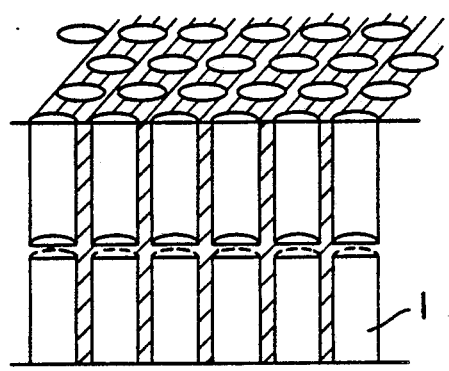
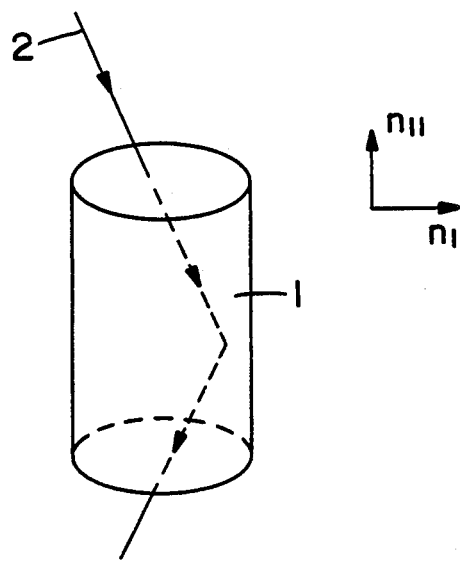
FIG. 4

(i)

NITRENE RADICAL (ii)

(iii)

OPTICALLY ORIENTED PHOTORESIST PATTERN FORMING METHOD USING ORGANIC CRYSTAL IN PHOTORESIST LAYER WITH SPECIFIED REFRACTING INDICES FORMULA

This application is a division of now abandoned application Ser. No. 07/072,120 filed July 10, 1987, abandoned.

BACKGROUND OF THE INVENTION

The conventional photoresist resin material extensively used in the present semiconductor production process, particularly the one used in an extremely fine pattern fabrication process is comprised of various combinations of amorphous high molecular resins. However, referring to FIG. 1, in a conventional photoresist resin layer 100, upon light irradiation, light flux 101 incident on the surface of said photoresist layer 100 is diffused isotropically, or vertically as well as horizontally, in said resist layer as illustrated in the drawing, and thus, the mask pattern is spread out and out of focus during said light propagation in said layer 100 even when a light pattern of high contrast and identical dimension is projected on said layer 100.

Therefore, in a case of a reduction projection aligner, a focus depth f is less than the thickness of said photoresist layer 100, and therefore, exactly reproduced images are formed only in a limited portion 100 A in said photoresist layer 100, and only blurred and out of focus images are produced in portions 100B and 100C.

Furthermore, if there exists a surface roughness 201 in an aluminum or other material layer 202 formed on said substrate 200 as shown in FIG. 2, said incident light is scattered by said roughness and is propagated in said photoresist layer 100 in random directions and lower the image contrast, thus in a positive type photoresist, the line width will become narrower and in a negative type photoresist, the line width will be broadened producing large dimensional errors between the mask pattern and the pattern reproduced in the photoresist, and an exact reproduction of the original pattern is difficult to obtain.

SUMMARY OF THE INVENTION

This invention offers a novel photoresist material which is made optically anisotropic in order to solve the above described drawback of a conventional photoresist which is isotropic, and in this novel photoresist layer formed on a substrate, anisotropic light propagation takes place producing an exact reproduction of the original mask pattern therein.

The novel photoresist of the invention provides a photoresist layer wherein the organic polymer molecules coated on a substrate are vertically oriented, and by this, the internal light propagation path is substantially confined in a normal direction to the substrate reproducing a projected exact mask pattern thereon. Furthermore, the present invention offers a novel pattern fabrication method by which the effects of light scattering on the surface of said photoresist layer are minimized, and a photoresist layer of a high durability against the etching process can be obtained.

While the novel features of the invention are set forth in the appended claims, the invention, both as to organization and content, will be better understood and appreciated, along with other objects and features thereof, from the following detailed description taken in conjunction with the drawing, in which:

BRIEF DESCRIPTION OF THE DRAWINGS

FIG. 3 is an illustration of a cross-section of an optically oriented photoresist layer of this invention;

FIG. 4 is a perspective view showing the light propagation therein;

DETAILED DESCRIPTION OF THE INVENTION

This invention relates to a photoresist material prepared by mixing a polymer and an organic molecular crystal, such as a liquid crystal, each having a different refractive index. Said photoresist material is applied on a substrate to form a photoresist layer on which an optical mask pattern is projected and irradiated to form a latent image of said mask pattern which is developed in a later stage for etching said substrate.

The liquid crystal has different refractive indices for its constituting crystal axes, therefore, if a liquid crystal photoresist is coated on a substrate for a proper thickness, its principal crystal axes can be oriented in a normal direction to said substrate as shown by FIG. 3 where 1 is said oriented photo-resist layer formed on said substrate.

Figure 1:
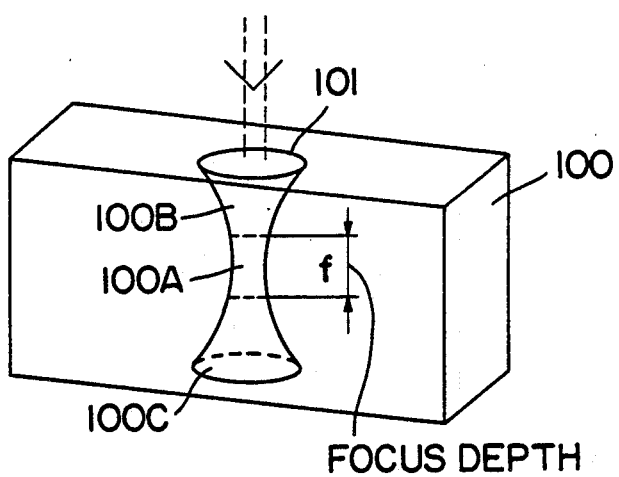
FIG. 1 is an illustration of light propagation paths in a conventional optically isotropic photoresist layer.
Figure 2:
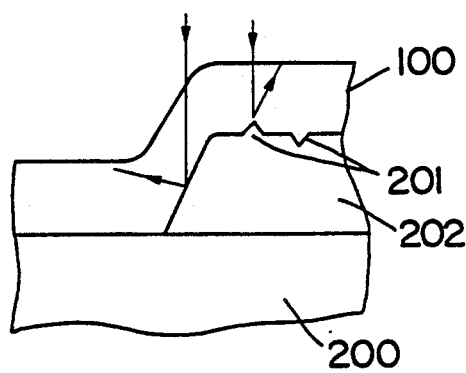
FIG. 2 is a sectional view showing a light propagation in a conventional optically isotropic photoresist formed on a substrate with various surface steps and roughness.

Because of the difference of refractive indices which is approximately 0.1 between the normal axial direction and an axial direction parallel to the substrate surface as shown by FIG. 4 the incident light on the surface of said photoresist layer 1 is propagated to said substrate surface and the photoresists existing in its incident light 2 path are exposed and a photoreaction takes place therein. Therefore, this means that a waveguide for the incident light 2 is formed there as illustrated by FIG. 1.

Figure 5:
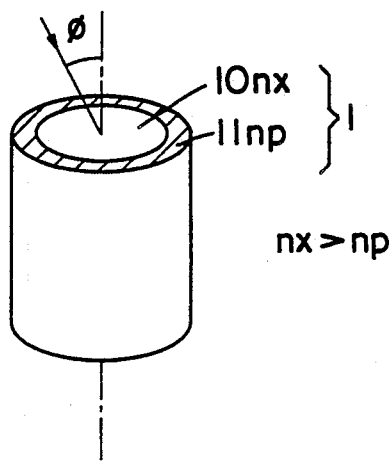
FIG. 5 is a perspective view showing the structures of a liquid crystal and a polymer each having a different refractive index.

Furthermore, if said oriented organic photoresist layer 1 consists of a liquid crystal 10 of a high refractive index and a polymer 11 of a low refractive index as shown by FIG. 5, said incident light can be propagated only through said liquid crystal 10 which has a higher refractive index. Since the incident light angle can be expressed by the numerical aperture $NA_o$ projected from a projection lens, the entire incident light is able to propagate through said liquid-crystal 10 so far as $NA_o$ is smaller than $NA_l$ of said liquid crystal.

The above described conditions can be expressed by the following formula;

$$NA_o < NA_l = \sqrt{n_x^2 - n_p^2} \quad (1)$$

wherein $n_x$ is the refractive index of a liquid crystal, and $n_p$ is the refractive index of a polymer.

For $n_x = 1.5$ and $NA_o = 0.5$, $$n_p < \sqrt{1.5^2 - 0.5^2} = 1.41$$

Therefore, if there exists a difference in refractive index of more than 0.09, said incident light propagates through said liquid crystal layer without scattering.

Figure 6:
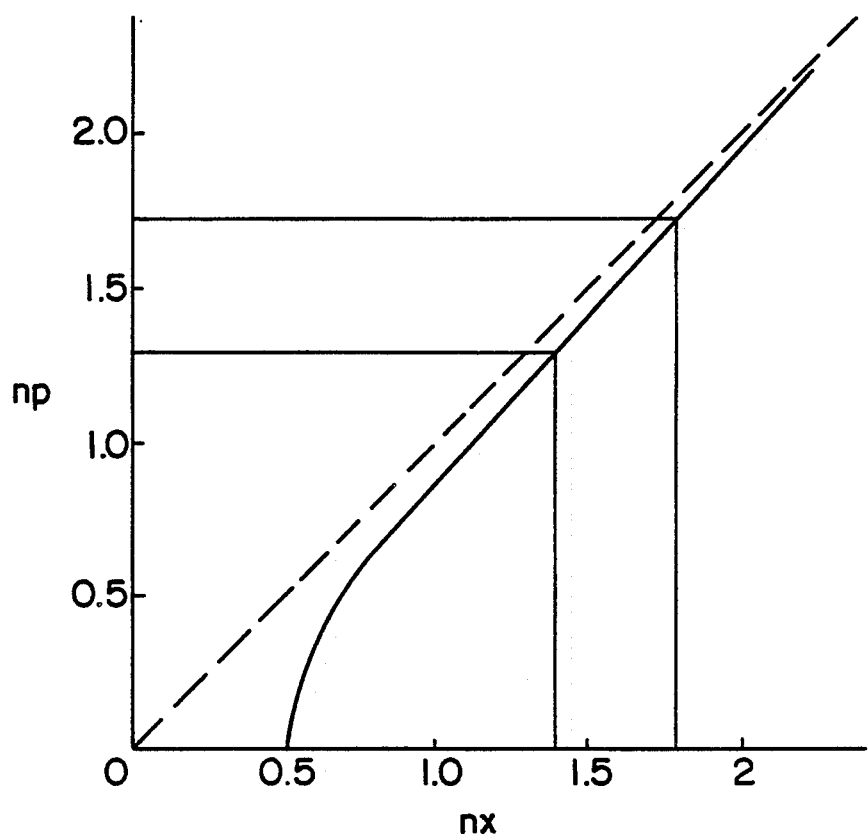
FIG. 6 is a graph dipicting the relationship between $n_x$ and $n_p$ shown in Formula 1.

The solid line in FIG. 6 shows the relationship between said respective refractive indices of said liquid crystal and said polymer expressed by Formula (1). As above described, if the difference of refractive index is more than 0.09, the images formed on the surface of said photoresist layer is precisely transmitted to the bottom of said photoresist layer. Furthermore, most of the light scattered at the bottom of said photoresist layer, or the surface of said substrate is reflected back toward the source along said oriented liquid crystal, relieving the effect of the boundary reflection at said substrate surface.

Even if said liquid crystal 10 and said polymer 11 were replaced by a high molecular substance and a low molecular organic crystal respectively, the identical relationship between the respective refractive index is maintained, and the light propagates only in said high molecular substance of a higher refractive index.

Furthermore, if a dye molecule with an elongated molecular structure is dissolved in said liquid crystal, said dye molecule is aligned with said liquid crystal molecule, or the dye molecule can be oriented along the direction of applied electric field by orienting said liquid crystal molecule according to an applied electric field, wherein said liquid crystal is called a host and said dye is called a guest, and said opto-electric effect is called as a guest-host effect.

A dichroic dye with distinctive optical absorption characteristics for its long and short axial directions are utilized since the incident light along the molecular orientation is propagated therein without absorption in said liquid crystal and produceds photoreactions therein while light for the orthogonal direction to said molecular orientation is strongly absorbed.

Figure 7:
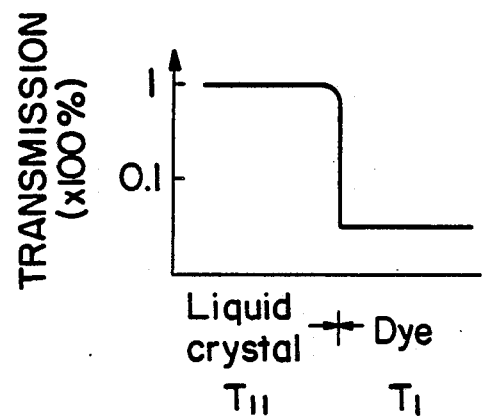
FIG. 7 is a graph depicting the transmissivity of light incident on an oriented photoresist containing a dichroic dye.

The light scattered at said substrate surface in the transverse directions are absorbed by said dichroic dye without producing any photreactions in said liquid crystal cell. This is illustrated by a ultraviolet light transmissivity (at 365 nm) shown in FIG. 7. There exists a difference of more than one order between the transmissivity for the vertical orientation, $T_\parallel$, and the orthogonal transmissivity $T_\perp$.

The coating of said organic crystal material on a substrate is performed by using a conventional spinner by which desired molecular orientation can not be attained. Therefore, said organic crystal material of a proper viscosity is dripped on said substrate for a proper thickness, 0.5-2 microns typically, and then said layer thus formed is annealed for obtaining a vertical (normal) orientation to said substrate.

An orienting agent may be added to said organic crystal material and in addition to said orientating agent, an electric or magnetic field may be applied thereon to obtain a high degree molecular orientation.

The axial dimension of said organic crystal material is highly related to the wavelength for said incident light. When the pitch of oriented crystal is less than one half of said wavelength, said material is optically isotropic within the plane parallel to said substrate surface, and no refraction takes place along said direction for the incident light. The light entering in said organic crystal layer is propagated, being repeatedly reflected by the outer wall and confined within said organic crystal in a manner shown by FIG. 4.

Since said incident light is determined by the total reflection condition given by Formula 1, said liquid crystal and polymer have to be so chosen that the maximum incident light from the objective lens ($NA_o$ the light corresponds to the lens numerical aperture) satisfies the above mentioned condition, or it should be set to be less than the numerical aperture of said liquid crystal.

Thus far, the liquid crystals were mentioned, however, certain crystallographic materials with an optical anisotropic property such as an inclusion compound can also be utilized as well for achieving the above described purposes.

Figure 8:
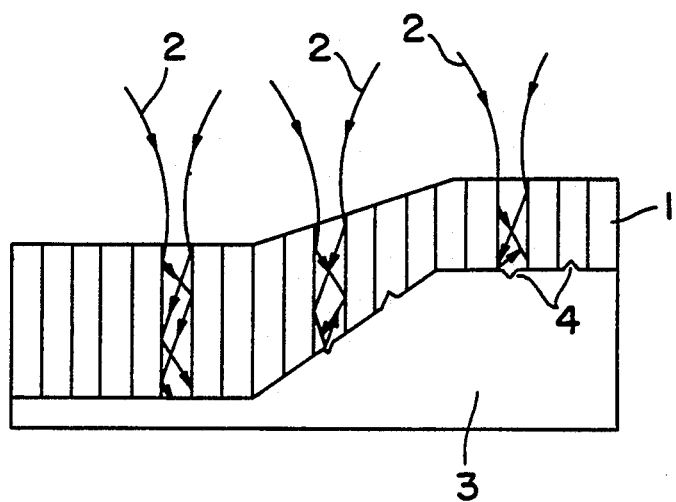
FIG. 8 is a sectional view showing a light path in an oriented photoresist layer formed on a substrate with a surface roughness and steps.

By means of a light propagation anistopy within an organic crystal produced by a difference between the refractive indices of the constituting crystal and polymer, the light entered in said oriented photoresist is confined within the direction for the higher refractivce index suppressing the spread of light in the orthogonal direction to said crystal orientation as shown by FIG. 8. Moreover the scattering due to a surface roughness can also be effectively supressed. Therefore, assuming a focal plane set at the surface of photoresist layer 1, the incident light 2 of a mask pattern propagates within said oriented photoresist, and the light reflected at said substrate surface is also reflected back through the identical path without being scattered. Therefore, unaffected by the steps and roughness on said substrate surface, a steep photographic pattern profile can be realized, and since the contrast of said incident light is not deteriorated in said photoresist, a high gamma value of the photoresist can be sustained.

Figure 9A:
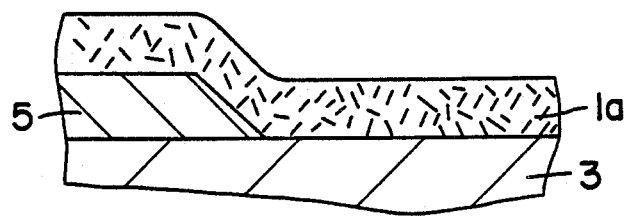
FIGS. 9A–9D are sectional views showing photolithographic processes which include photoresist coating, light irradiation and development processes.

As an orientating agent, poly-PBLG ($\gamma$-benzyl L-glutamate) of molecular weight approx. 50,000, and, as a sensitizer (a bridging agent), bisazide is introduced in the high polymer liquid crystal wherein bisazide is added to a polymer whose refractive index is smaller than PBLG, such as poly vinyl alcohol added by a starch, and these are mixed with PBLG. PBLG and the polymer are mixed to a weight ratio of 10 to 0.1-5. This mixed liquid crystal is conditioned by using water or alcohol for a suitable viscosity for spinner application on a semiconductor substrates to form a coated layer 1a of 1 micron thick as shown by FIG. 9A wherein 5 is an insulating or conduction layer formed on said substrate, but it can be a multilayer of metal and insulator deposited on said semiconductor substrate.

Figure 9B:
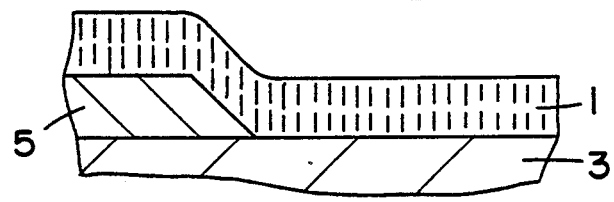

The solvent is evaporated at a suitable elevated temperature after said photoresist coating for obtaining a liquid crystal layer, and during its cooling period, an electric field (e.g. 100 V/cm) or a magnetic field (e.g. 11 KG) is applied in order to orienting the liquid crystal resist layer 1 as shown by FIG. 9B. Thus said liquid crystal is vertically oriented to the substrate 3 as shown by FIG. 8.

Figure 9C:
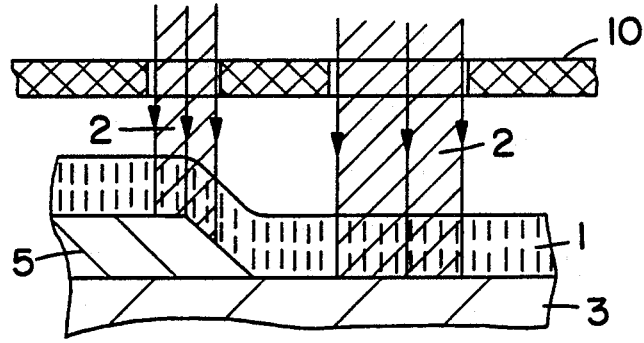

The ultraviolet light 2 of a photomask pattern 10 is selectively irradiated on said oriented liquid crystal layer 1 making its surface a focal plane in order to produce a molecular bridging reaction therein or to increase the molecular weight thereof as shown by FIG. 9C. Bisazide is reacted by the photoquantum irradiation and nitrene radicals are produced, and said radical produces three kind of chemical reactions therein, i.e. hydrogen pull out, bridging, and coupling with the surrounding methyl, vinyl groups and bisazide itself to increase their molecular weight. The viscosity of liquid crystal is increased as the increase of its molecular weight and with an additional polymerizing reaction. It is proportional to a power of 3.5-8 of its molecular weight. Therefore, in contrast to the viscosity of 500 CP corresponding to its molecular weight before bridging reaction, the CP of the photoresist increases $5 \times 10^4$ times after the bridging reaction which increases the molecular weight by ten times.

Figure 9D:
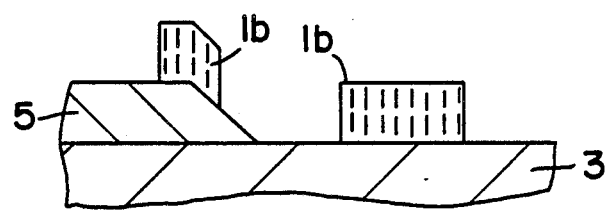
Figure 10:
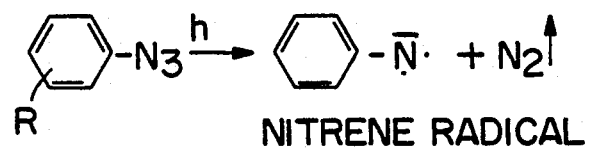
FIG. 10 is an illustration showing a photochemical reaction which takes place in bisazide.
Figure 10:
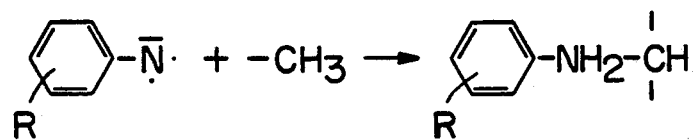
Figure 10:
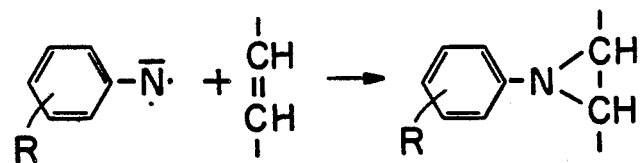
Figure 10:
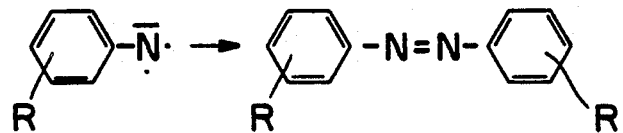

As above described, the viscosity of said reacted polymer increases extremely, and the solubility of the light irradiated portion also decreases extremely. For example, the solubility of polyvinyl alcohol against water or water solution of alcohol is so decreased that it can be developed by these solutions without causing any swell of said resist layer. Thus the latent images of less than 0.5 micron line width formed in the oriented photoresist layer can be developed as a photoresist pattern of one micron thick as shown by FIG. 9D.

Said oriented photoresist is then subjected to an annealing process which increases the molecular weight still further and thus the durability against the dry-etching, and therefore, the mask pattern thus formed can be used as a mask for dry-etching said substrate.

For a substrate with a high reflectivity, such as a substrate with an aluminum layer thereon is formed, an oriented photoresist of another type of this invention can be prepared by introducing a dichroic dye, or anthraquinone, into a high polymer liquid crystal, and by this, fine mask patterning therein then becomes possible.

Referring now to FIG. 9, a combination of 4-(trans-4-n-propylcyclohexyl) as a low molecular liquid crystal, and poly (γ-benzyl L-glutamate) as a high polymer liquid crystal can also be employed. Since the difference of refractive index between them is approximately 0.1, this satisfies the conditions for the formation of the light waveguide of this invention.

After the introduction of a proper amount of 4-azide chalcone to both said liquid crystals by a proper method, both liquid crystals are mixed together at 1 to 1 volume ratio to obtain a photoresist 1a which is spin coated on a silicone substrate after dimethyl dichlorosilane as an orienting agent is undercoated. By going through the identical molecular orienting, exposure, and development processes, a steep pattern profile can also be obtained.

In order to orient the crystals to form an oriented photoresist, one of the following coupling agents such as dimethyl dichloro silane, stearytrichlorosilane, diphenyl dichlorosilane, phenyltrichlorosilane, and lecithin can also be employed, and beside of above, a method where the electric or magnetic field is applied can be employed. The development method for the above mentioned photoresist material should be individually adjusted for the properties of each agents.

A bisazide photo-sensitive group can be introduced into a low molecular liquid crystal family, such as azomethene, azoxy, or ester family as an orienting agent by a suitable method. As a photosensitive group other than above mentioned material, 4-azidechalocone, cinnamic acid ester, benzalacetophenone, stearyl-pyridinium, diazo, azide, maleimide, diphenylcyclopropane coumarin, anthracene, D-phenylenediacrylate, and distyrxlketone groups and can also be employed. 2, 4, 6-trinitroaniline, P,P'-tetramethyl diamino benzophenone, or 5-nitro acenaphthene can be added as a sensitizer if desired.

As a bridging agent, bisazide added to a polymer such as polyvinyl alcohol, starch or cyclogum and is mixed with a low molecular liquid crystal, can also be used. The mixing ratio of a low molecular liquid crystal to a polymer is 10 to 0.1-5 respectively.

The viscosity of a low molecular liquid crystal mixture can be approximately 10 CP, and by this said substrate can be coated for a thickness of 0.5 to 1 micron, and after said coating process, the substrate is subjected to a heat treatment or an annealing. An electric field can be applied during the cooling period of said annealing for a better molecular orienting.

For a low molecular liquid crystal, one of the before described low molecular liquid crystals is overcoated on the substrate after an orienting agent, such as dimethyl dichlorosilanc, is undercoated first on said substrate. Said substrate is then annealed, and cooled during which an electric field of 10,000 V/cm is applied for the better orienting. The refractive index of said oriented liquid crystal thus obtained can be approximated by $n_x - n_p = 0.15$, which is larger than the refraction index difference 0.14 which is determined by the numerical aperture of the lens.

The ultraviolet light is irradiated on said oriented liquid crystal layer thus formed in order to increase the molecular weight by 10 times, by means of the reaction of photosensitive groups. The viscosity of said liquid crystal layer is increased by a power of 5.5 to 8 of the molecular weight, and thus the viscosity after the bridging reaction, comes close to $10^5$ CP since the viscosity prior said bridging is approximately 10.

As above described, the viscosity of the reacted polymer increases extremely, and the chemical property of the light irradiated portion changes extremely also including the properties with respect to the developer. By making use of these changes, latent images less than 0.5 micron line width formed in the oriented photoresist layer of one micron thick can be realized.

Further heat treatment of said oriented photoresist layer with a mask pattern reproduced therein increases the molecular weight still further and improves the resistivity against the dry etching.

In another embodiment, an inclusion compound, or cyclodextrin, is mixed with a fine liquid crystal material, and is coated on a substrate, and said inclusion compound is oriented under an applied electric field. The structure of said oriented photoresist thus obtained is shown by FIG. 3. A photosensitive group is added to the oriented dextrin, and it may be decomposed or bridged under the light irradiation to form a latent image therein.

The photoresist structure of this invention is transformed into an optically anisotropic structure under the light irradiation, and the isotropic optical diffusion of the projected pattern is hindered, and thus a steep and extremely fine pattern profile can be attained on the substrate on which said photoresist is coated.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. A resist pattern forming method comprising the steps of:

disposing an optically oriented photoresist layer on a substrate in such a manner that orientation of said photoresist layer is normal to a surface of said substrate, said optically oriented photoresist being composed of an organic polymer with a refractive index $n_p$, an organic crystal with a refractive index $n_x$, and a photosensitizer, wherein the relationship between said refractive indices $n_x$ and $n_p$ is expressed by the formula $n_x^2 - n_p^2 > (NA_o)^2$ for the numerical aperture $NA_o$ of a projection lens employed for photolithographic exposure;

irradiating said surface of said photoresist layer with incident light through a photomask, whereby said incident light is propagated through said photoresist layer to the bottom of said layer without scattering; and developing said photoresist layer to form a resist pattern.

2. The resist pattern forming method of claim 1, wherein said organic crystal is a liquid crystal.

3. The resist pattern forming method of claim 1, which further comprises the step of annealing said optically oriented photoresist after the step of disposing said optically oriented photoresist layer on said substrate.

4. The resist pattern forming method of claim 3, which further comprises the step of applying an electric or a magnetic field during said annealing.

5. A resist pattern forming method comprising the steps of:

disposing an optically oriented photoresist layer on a substrate in such manner that orientation of said resist is normal to a surface of said substrate, said optically oriented photoresist being composed of a low molecular organic crystal with a refractive index $n_x$, a high molecular organic crystal with a refractive index $n_p$, and photosensitizer, wherein the relationship between said refractive indices $n_x$ and $n_p$ is expressed by a formula $n_x^2 - n_p^2 > (NA_o)^2$ for a numerical aperture $NA_o$ of a projection lens employed for photolithographic exposure;

irradiating said surface of said oriented photoresist layer with incident light through a photomask, whereby said incident light is propagated through said photoresist layer to the bottom of said layer without scattering; and developing said photoresist layer to form a resist pattern.

6. The resist pattern forming method of claim 5, which further comprises the step of annealing said optically oriented photoresist after the step of disposing said optically oriented photoresist layer on said substrate.

7. The resist pattern forming method of claim 6, which further comprises the step of applying an electric or a magnetic field during said annealing.

* * * * *